United States Patent
Rogers

(10) Patent No.: US 11,019,714 B1
(45) Date of Patent: May 25, 2021

(54) WAVEFORM DETECTION OF STATES AND FAULTS IN PLASMA INVERTERS

(71) Applicant: Atmospheric Plasma Solutions, Inc., Cary, NC (US)

(72) Inventor: Terrence E. Rogers, Durham, NC (US)

(73) Assignee: Atmospheric Plasma Solutions, Inc., Cary, NC (US)

( * ) Notice: Subject to any disclaimer, the term of this patent is extended or adjusted under 35 U.S.C. 154(b) by 0 days.

(21) Appl. No.: 17/085,475

(22) Filed: Oct. 30, 2020

(51) Int. Cl.
| | |
|---|---|
| H05H 1/36 | (2006.01) |
| H01F 38/10 | (2006.01) |
| H03M 1/12 | (2006.01) |
| H01F 27/38 | (2006.01) |

(52) U.S. Cl.
CPC ............. *H05H 1/36* (2013.01); *H01F 27/385* (2013.01); *H01F 38/10* (2013.01); *H03M 1/1245* (2013.01); *H05H 2240/10* (2013.01)

(58) Field of Classification Search
None
See application file for complete search history.

(56) References Cited

U.S. PATENT DOCUMENTS

| | | | | |
|---|---|---|---|---|
| 9,554,738 | B1* | 1/2017 | Gulati | A61B 5/0075 |
| 10,190,916 | B1* | 1/2019 | Adams | G01S 17/08 |
| 10,304,663 | B1* | 5/2019 | Kapoor | H01J 37/32183 |
| 10,559,454 | B2* | 2/2020 | Berdnikov | H01J 49/062 |
| 10,565,329 | B2* | 2/2020 | Greenwood | G06F 17/00 |
| 2004/0160190 | A1* | 8/2004 | Gonzalez | H01J 37/321 |
| | | | | 315/111.51 |
| 2009/0027936 | A1* | 1/2009 | Glueck | G01R 21/06 |
| | | | | 363/132 |
| 2012/0187840 | A1* | 7/2012 | Hensley | H05B 41/2806 |
| | | | | 315/111.21 |
| 2013/0278140 | A1* | 10/2013 | Mudunuri | H01J 65/042 |
| | | | | 315/111.21 |
| 2015/0364315 | A1* | 12/2015 | Ramsey | H01J 49/424 |
| | | | | 250/282 |
| 2017/0018926 | A1* | 1/2017 | Coumou | H01J 37/32183 |

(Continued)

FOREIGN PATENT DOCUMENTS

| | | | | |
|---|---|---|---|---|
| WO | 2014/080211 A1 | | 5/2014 | |
| WO | WO-2014080211 A1 | * | 5/2014 | ............ H02M 7/538 |
| WO | 2020214747 A1 | | 10/2020 | |

OTHER PUBLICATIONS

International Search Report and Written Opinion dated Jul. 17, 2020 by the ISA/US for related application PCTUS2028401 (16 pages).

*Primary Examiner* — Amy Cohen Johnson
*Assistant Examiner* — Srinivas Sathiraju
(74) *Attorney, Agent, or Firm* — Olive Law Group, PLLC

(57) ABSTRACT

A system for determining an operational state of an atmospheric pressure plasma. The system has a transformer for coupling power into the atmospheric pressure plasma, a current sampling circuit configured to sample at least one current pulse flowing through a primary winding of the transformer, and a programmed microprocessor configured to determine, from a waveform of the current pulse, the operational state of the atmospheric pressure plasma. The operational state is one of: a no plasma state, a plasma origination state indicative of an ignited arc expanding into a plasma by gas flow thereinto, and a plasma maintenance state indicative of the plasma being expanded.

17 Claims, 16 Drawing Sheets

(56) References Cited

U.S. PATENT DOCUMENTS

| | | | |
|---|---|---|---|
| 2017/0147722 A1* | 5/2017 | Greenwood | G06F 30/20 |
| 2017/0301516 A1 | 10/2017 | Bhutta et al. | |
| 2018/0063937 A1* | 3/2018 | Eckert | A61B 18/042 |
| 2018/0288863 A1* | 10/2018 | Fujimaki | H05G 2/006 |
| 2020/0325049 A1* | 10/2020 | Roy | C02F 1/78 |
| 2021/0051790 A1* | 2/2021 | Yancey | H05H 1/30 |
| 2021/0051793 A1* | 2/2021 | Rogers | H05H 1/24 |

* cited by examiner

WAVEFORM DETECTION OF STATES AND FAULTS IN PLASMA INVERTERS

CROSS REFERENCE TO RELATED APPLICATIONS

This application is related to and claims priority to PCT/US/20/28401 (entire contents of which are incorporated herein by reference), filed Apr. 16, 2020 entitled "Waveform Detection of States and Faults in Plasma Inverters," which is related to and claims priority to U.S. Ser. No. 62/834,947 filed Apr. 16, 2019, entitled "Waveform Detection of States and Faults in Plasma Inverters," the entire contents of which are incorporated herein by reference. This application is related to and claims priority to U.S. Ser. No. 62/834,545 filed Apr. 16, 2019, entitled "Frequency Chirp Resonant Optimal Ignition Method," the entire contents of which are incorporated herein by reference. This application is related to U.S. Ser. No. 62/834,119 filed Apr. 15, 2019, entitled "Asymmetrical Ballast Transformer," the entire contents of which are incorporated herein by reference.

BACKGROUND OF THE INVENTION

Field of Invention

The invention relates to ways to indirectly detect faults and operational states of plasmas.

Discussion of the Background

Plasma technology applications include, for example, semiconductor, various surface modifications, and coatings of reflective films for window panels and compact disks. Plasmas ranging in pressure from high vacuum (<0.1 mTorr) to several Torr are common and have been used for film deposition, reactive ion etching, sputtering and various other forms of surface modifications. For example, gas plasmas are known for the treatment of plastics and molded substrates (e.g., thermoplastic olefin substrates used as bumpers and fascia in the automotive industry) to improve adhesion of subsequently applied coating layers. The modification typically is a few molecular layers deep, thus bulk properties of the polymeric substrate are unaffected. A primary advantage of using plasma for such purposes is that it results in an "all dry" process that generates little or no effluent, does not require hazardous conditions such as toxic chemicals or high pressures, and is applicable to a variety of vacuum-compatible materials, including, inter alia, semiconductors, metals, glasses, polymers, composites and ceramics It is commonly known to use plasma, typically $O_2$ plasmas, as a means of removing hydrocarbon and other organic surface contaminants from various substrates. However, because of the short lifetime of these reactants and their line-of-sight reactivity on the surface, these highly activated reactants are not especially well-suited for surface cleaning of irregular surfaces, unpolished or roughened metallic surfaces, or surfaces having a three-dimensional topography.

Also, use of plasma at reduced pressures has several disadvantages in that the substrate to be treated or cleaned must be placed under vacuum and must be capable of surviving under such reduced pressure conditions. Use of a plasma at or above atmospheric pressure avoids these drawbacks.

Yet, the coupling of power into atmospheric pressure plasmas is not straight forward, especially during the time frame when the gas transitions into a plasma. The gas presents a high impedance to the power source, while the resultant plasma appears as a low impedance load to the power source, with the transition from these states resulting in a dynamic change in impedance and current surges.

SUMMARY

In one embodiment of the invention, there is provided a system for determining operational states of an atmospheric pressure plasma. The system has a power coupler for coupling power into the atmospheric pressure plasma, a current sampling circuit configured to sample at least one current pulse flowing through a primary winding of the transformer, and a programmed microprocessor configured to determine, from a waveform of the current pulse, the operational state of the atmospheric pressure plasma. The operational state is one of: a no plasma state, a plasma origination state indicative of an ignited arc expanding into a larger volume of plasma by gas flow thereinto, and a plasma maintenance state indicative of the plasma being expanded.

In one embodiment of the invention, there is provided a system for determining operational states of an atmospheric pressure plasma. The system has a power coupler for coupling power into the atmospheric pressure plasma, a current sampling circuit configured to sample at least one current pulse flowing to a plasma-generating region, and a programmed microprocessor configured to determine, from a waveform of the current pulse, the operational state of the atmospheric pressure plasma. The operational state is one of: a no plasma state, a plasma origination state indicative of an ignited arc expanding into a larger volume of plasma by gas flow thereinto, and a plasma maintenance state indicative of the plasma being expanded.

In one embodiment of the invention, there is provided a method for determining an operational state of an atmospheric pressure plasma using the system described above.

In one embodiment of the invention, there is provided a ballast transformer whose operation is controlled in part by the system described above.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

In various embodiments, the present invention provides systems and methods for determining operational states of an atmospheric pressure plasma. As used herein, atmospheric pressure refers to the absolute pressure of the ambient in which the device generating the "atmospheric pressure" is disposed. In various embodiments, the present invention uses a programmed microprocessor to determine (from a waveform of a current pulse driving a ballast transformer coupled to the plasma) an operational state of the atmospheric pressure plasma. The operational state is one of a no plasma state, a plasma origination state indicative of a gas-flow expansion of an arc ignited in the plasma chamber expanding into a plasma by gas flow thereinto, and a plasma maintenance state indicative of sustaining the plasma in the plasma chamber.

Atmospheric Plasma Source

Figure 1A:
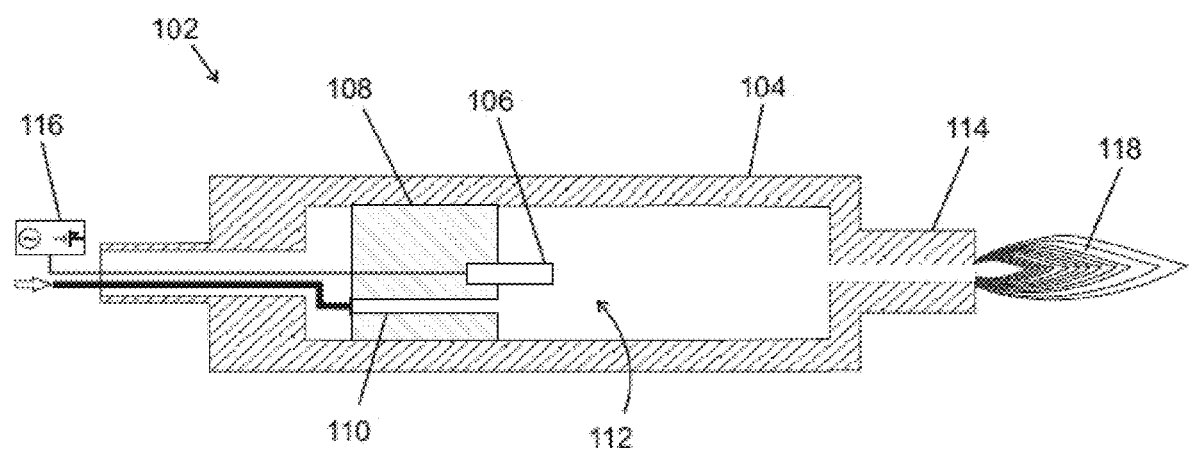
FIG. 1A is a schematic of an atmospheric plasma source.

FIG. 1A is a lengthwise cross-sectional view of an exemplary AP plasma source 102 to which the operational states can be determined. The AP plasma source 102 includes an axially elongated plasma-generating chamber 104 or other structure that serves as a ground electrode for generating a plasma and that serves as a conduit for flowing gases into the plasma. The plasma-generating chamber 104 may be enclosed in an electrically- and thermally-insulating housing (not shown). A "hot" or powered electrode 106 is located in the plasma-generating chamber 104. Electrical connections to the hot electrode 106 may be made through a dielectric structure 108 located at the proximal end of or in the plasma-generating chamber 104. One or more gas inlets 110 may be formed through the dielectric structure 108 in fluid communication with the plasma-generating chamber 104. The gas inlets 108 may be placed in fluid communication with a gas supply source. Accordingly, the gas inlets 110 provide a flow path for plasma-generating gas fed to plasma-generating region 112 within the plasma-generating chamber 104 proximate to the hot electrode 106. In operation, the plasma is generated in region 112 and subsequently flows (with the gas flow) toward a nozzle 114 positioned at a distal end of the plasma-generating chamber 104.

Generally, operating parameters associated with the AP plasma source 102 are selected so as to produce a stable plasma discharge. Control 116 having a processor is used for setting and controlling the operating parameters which depend on the particular application ranging, for example, from nanoscale etching of micro-fabricated structures or devices (e.g., MEMS devices) to removing large areas of paint from aircraft carriers. Examples of operating parameters are provided below with the understanding that the teachings herein are not limited by such examples. In the case of generating an air plasma, the rate at which the air is fed to the AP plasma source 102 may range from $1\times10^{-6}$ SCCM to $1\times10^{6}$ SCCM. The feed pressure into the AP plasma source 102 may range from 1 Pa to $1\times10^{7}$ Pa. The power level of the electrical field driving the plasma may range from $1\times10^{-6}$ to $1\times10^{6}$ W. The drive frequency of the electrical field may range from DC (0 GHz) to 100 GHz. The separation distance, i.e. the distance from the nozzle exit to the exposed surface of the material to be removed, may range from $1\times10^{-6}$ m to 40 cm. The scan speed, i.e. the speed at which the AP plasma source 102 may be moved across (over) the surface of the material, may range from $1\times10^{-4}$ m/s to 10 m/s. Related to the scan speed and power is the time averaged power density. Also related to the scan speed is the dwell time, i.e., the period of time during which a particular area of the material is exposed to the plasma plume, which may range from $1\times10^{-9}$ s to $1\times10^{3}$ s.

In one embodiment of the present invention, AP plasma source 102 has a converging nozzle (i.e., a straight conical cross-sectional flow area without being followed by a diverging section), has been fabricated and evaluated. The AP plasma source repeatably and reliably produces a plasma plume which may include the production of shock waves. The AP plasma source generates an air plasma using air at about room temperature as the feed gas. The air may be fed to an AP plasma source of this type at a pressure ranging from 30-110 psi and at a flow rate ranging from 1-7.5 CFM. In another example, the pressure range is 65-95 psi. In another example, the flow rate range is 1-4 CFM. Pressures higher than 110 psi may also be implemented to produce shock waves. In a more general example, the pressure may be 30 psi or greater and the flow rate may be 1 CFM or greater.

Under these conditions, at plasma ignition, there is a (typically small) arc from the driven or "electrically hot" electrode to the chamber wall, and the gas flow "expands" the spatially confined arc into a diffused volume of plasma or plasma plume 118 extending out of the outlet 114. The electrical impedance before and after plasma ignition and during the expansion of the arc vary greatly as detailed below.

Figure 1B:
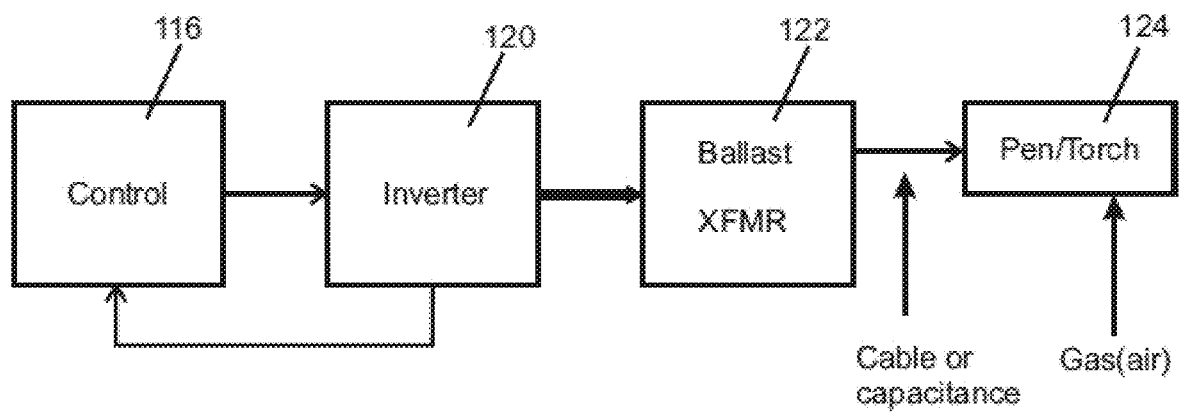
FIG. 1B is a schematic of a system for coupling power to an atmospheric plasma.

The present invention provides as shown in FIG. 1B a system for providing power to the plasma during these changing load resistance conditions by way of an inverter 120 (controlling for example the AC frequency of a square wave pulse signal) and a ballast transformer 122. In this system, a leakage inductance of the ballast transformer 122 serves the purposes of both a) limiting the current into a variable load when driven by a fixed voltage AC source and b) providing a resonance with cable capacitance and therefore can provide a high voltage to ignite a plasma.

Circuit Analysis

Figure 2:
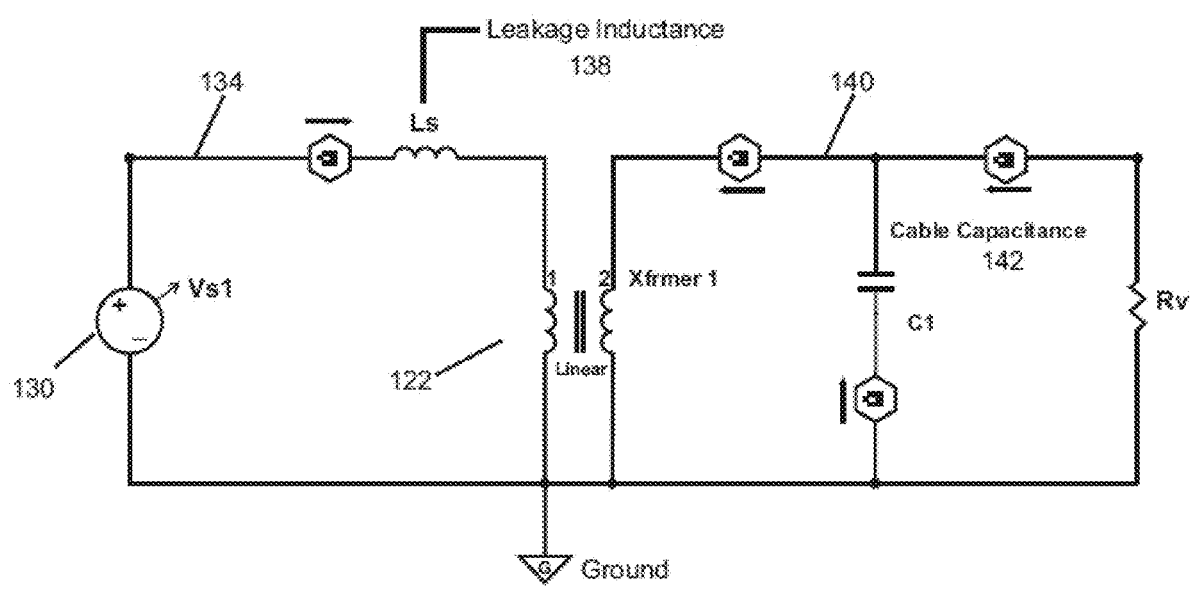
FIG. 2 is a schematic circuit model of a ballast transformer coupled to a variable resistance load.

FIG. 2 is a schematic circuit model of asymmetric ballast transformer 122 of the present invention for coupling to a variable load Rv such as a plasma load, including but not limited to an atmospheric pressure plasma pen (discussed above) or a cutting torch (discussed below). As shown in FIG. 1, an AC voltage source 130 is coupled to transformer 122 by coupling connections 134. The AC voltage source can provide an AC waveform which may be sinusoidal, square wave, or other arbitrary pulsed or bi-polar waveform, and provide a waveform whose frequency can be varied. The voltage source 130 supplies current which flows through the primary windings 1. The current through windings 1 induce current flow through the secondary windings 2 of transformer 102, producing a step up or step down AC voltage which appears across the variable plasma load Rp. A coaxial connection 140 is used in this circuit to connect the transformer 122 to the variable plasma load $R_v$, but other types of electrical interconnects with or without filtering could be used in addition or instead of the coaxial connection 140. As shown in FIG. 1, a leakage inductance Ls 138 and cable capacitance 142 (from the coaxial cable) appear in this circuit.

A plasma, when fully formed, would appear in the circuit schematic of FIG. 2 as a resistance Rp, here between 0.3-5 kOhms. However, before plasma ignition, Rp is 100's of thousands or millions of Ohms and immediately after ignition is less than 2 Ohms. Note that the current TPiOut is in waveshape nearly the same as current TPIXFMR (i.e., a plasma drive current waveform) on driving side since every transformer is a current transformer. As a close approximation, the magnitude of TPiOut current is nearly TPIXFMR/N, the turns ratio which is known or discoverable. Therefore, it is not necessary to measure current with a special device on the secondary or plasma side where higher voltages and higher noise may exist. The ability to measure or calculate the secondary current without a separate and potentially expensive or physically large device is one advantage of the present invention.

To address the issue of the maintenance of proper operational states of an atmospheric pressure plasma, the present invention discovered that, through the monitoring of plasma drive current waveforms (e.g., TPIXFMR), both proper and improper operational states of the atmospheric pressure plasma can be determined. Accordingly, in one embodiment of the invention, there is provided a programmed microprocessor (such as control 116 shown in FIGS. 2A and 2B) configured to detect the state of a plasma by monitoring the plasma drive current waveform (e.g., TPIXFMR). The microprocessor can be programmed to make decisions as to what action(s) to take based on for example one or more of a) the waveshape of the plasma drive current waveforms, b) the amplitude and operating sequence of the plasma drive current waveform (for example did the plasma form when expected in the startup phase or is it too hot or weak during the work phase), and c) resonances appearing in the drive current waveforms.

There are a number of process variables (discussed below) which can affect an atmospheric plasma (its ignition and maintenance). In one embodiment of the invention, the effect of such process variables on the atmospheric plasma can be determined via monitoring of the plasma drive current waveform(s), with for example a microprocessor (such as control 116 shown in FIGS. 2A and 2B) programmed with correlation or spectral analysis software in order to monitor not only the plasma drive current waveform, but also for example the plasma gas supply, the inverter drive current, and the correlation coefficient.

In one embodiment of the invention, a microprocessor determines and stores for example the correlation coefficient (e.g. nominally at 0.1), a Fourier component relative phase (e.g., from 0 to 180 degrees), air or gas supply in SLM, Standard Liters/Minute, a pressure provided into a known air supply line and plasma generator hardware, and/or drive current in amperes rms and peak to peak type (e.g. 10 to 18 $A_{rms}$ or 15 to 50 $A_{p-p}$).

In general, ballast transformers have a leakage inductance $L_s$ that appears in a simple analysis to be a separate inductor (leakage inductor) in series with the primary and or the secondary. If the leakage inductance $L_s$ is sufficiently large, the present inventors have realized that this inductance will serve both a) to limit the current into a variable load when driven by a fixed voltage AC source and b) to provide a resonance with the cable capacitance and therefore can provide a high voltage to ignite a plasma.

Asymmetric Ballast Transformer

Figure 3:
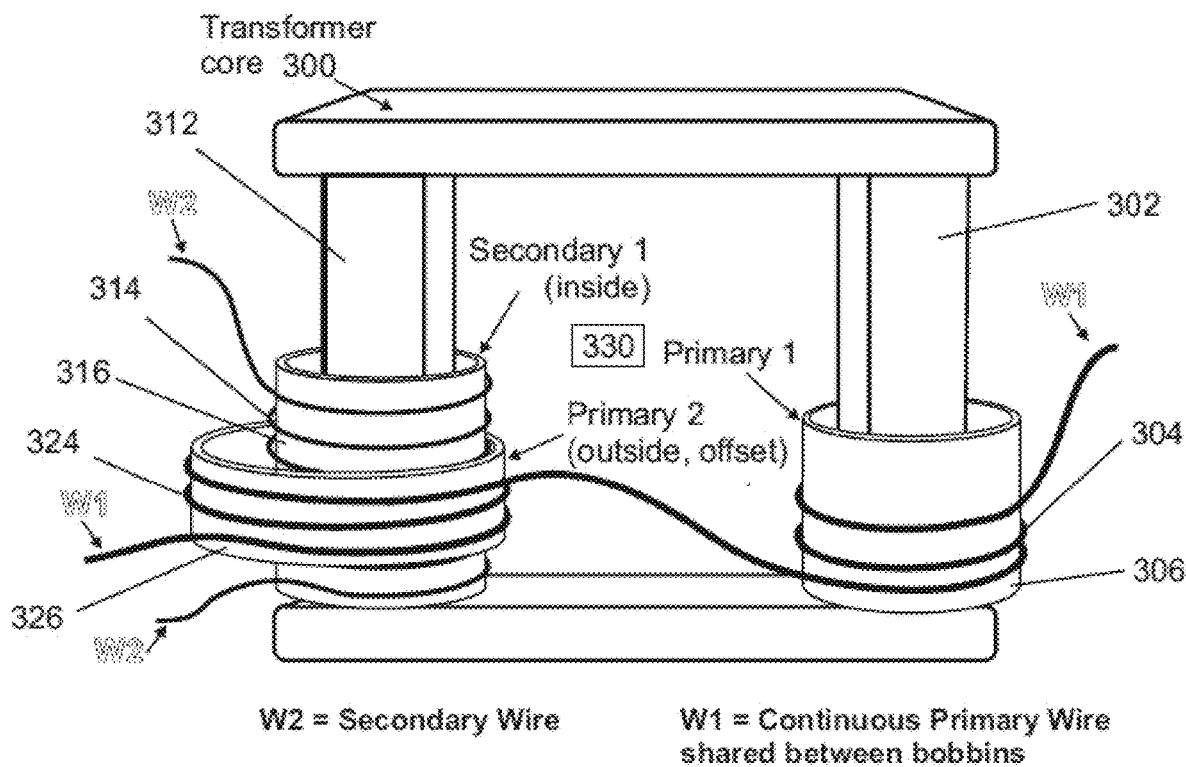
FIG. 3 is a schematic of an asymmetrical ballast transformer of the present invention.

FIG. 3 is a schematic of a ballast transformer of the present invention. The ballast transformer of FIG. 3 is shown as an illustrative way for the present invention to couple power to a plasma (i.e., a power coupler) As shown in FIG. 3, a magnetic flux circuit comprises a transformer core 300 forming a magnetic loop (which could include air gaps not shown) linking a primary side 302 of the transformer to a secondary side 312 of the transformer. The primary side 302 comprises a first primary winding 304 of wire W1 on bobbin 306. Wire W1 connects to an AC power source (not shown in FIG. 3), but similar to voltage source 130 in FIG. 2. The secondary side 312 comprises a second winding 314 of wire W2 on bobbin 316. Wire W2 connects to a variable load not shown in FIG. 3, but similar to variable load Rv in FIG. 2.

In FIG. 3, bobbin 316 is illustrated for a high voltage secondary. Bobbin 316 has wire W1 wound around it. In one embodiment of the invention, bobbin 316 fits inside primary bobbin 326 to provide coupling thereto. The position of primary bobbin 326 on the second pole can vary from design to design to provide an adjustable coupling to the secondary winding 324 and/or to the transformer core 300. Primary bobbin 326 typically has a lower coupling to the transformer core than either the secondary winding 324 or the primary winding 304 on bobbins 316 and 306, respectively.

Accordingly, in one embodiment of the invention, the primary winding on transformer core 300 is split by the presence of second primary winding 324 in proximity to (e.g., wrapped around or coaxially surrounding) the secondary winding 314. This second primary winding 324 (connected in series with the winding primary winding 304) can be a non-coaxial and/or a coaxial winding relative to the secondary winding 314 so that it is possible to control the coupling coefficient (leakage inductance) and optimize the trade-off between maximum flux density, core heating, and wire losses without the necessity of auxiliary adjustable flux paths. In one embodiment, the relative positions of bobbin 306, bobbin 316, and/or bobbin 326 to the transformer core (and/or to each other) can be adjusted or can otherwise be fixed at different relative positions.

In one embodiment of the invention, the primary bobbin 306 (as noted above) is offset from primary side 302 of the transformer core. This offset allows magnetic flux to leak out and be intercepted by second primary winding 324 wound on bobbin 326.

In one embodiment of the invention, one of the primary or secondary windings provides tight coupling while the other provides loose coupling while simultaneously providing a) enough leakage inductance to limit flux density to a safe level, b) at least a turns ratio to develop the operating or developed plasma voltage and more, and c) a reasonable leakage inductance for resonance condition for ignition and use that same leakage inductance for ballast when there is a developed plasma. In one embodiment of the invention, the leakage is adjusted by construction of the ballast transformer components so as not to change the turns ratio all the while keeping the transformer compact while avoiding extra ferrite flux path elements.

Accordingly, in one embodiment of the invention, the ballast transformer has a magnetic core, a first primary winding on a first side of the magnetic core and connected to the AC power source, a secondary winding on a second side of the magnetic core, and a second primary winding connected in series with the first primary winding and wound coaxial to the secondary winding on the second side of the magnetic core, and the leakage inductance is generated by second primary winding connected in series with the first primary winding. However, the present invention is not limited to this configuration.

Below are details of a constructed asymmetrical ballast transformer of the present invention.

---
Ballast Transformer Design
---
Operational Input: Pulsed 300 V above ground signal at pulse frequency from 20-500 kHz
Transformer Design:
Primary Rating: 230 VAC
Epoxy coating or other coating to hold primary wire and secondary wire in place on bobbins and to prevent vibration in use.
First Primary Winding: wire size #12 AWG, 1-15 turns
First Primary Winding Inductance: 0.5-10 µH at 10 KHz, no core
Second Primary Winding: wire size #12 AWG, 1-15 turns
Second Primary Winding Inductance: 0.5-10 µH at 10 KHz, no core
Total Primary Windings: 2-30 turns
Total Primary Winding Inductance: 500-2000 µH at 10 KHz, with core, Q = 300
Secondary Winding: wire size #22 AWG, ~200 turns, layered windings
Secondary Winding Inductance: 100 to 1000 µH at 10 kHz, no core
50 to 5000 mH at 10 kHz, with core, Q = 500
Measured Leakage Inductance: 5-100 µH at 10 kHz, with core, Q = 30

Typically, for the asymmetrical ballast transformer of the present invention, a coupling coefficient is about 0.97, and a magnetization inductance (inductance of the primary winding 304 and secondary winding 314) is about 30 times greater than the leakage inductance. According to one embodiment of the invention, the leakage inductance is preferably of a value that limits current in the primary side at the instant the plasma ignites. Plasma ignition represents a tremendous change in impedance from that of an open circuit prior to ignition to that appearing almost as a short circuit after plasma ignition.

Further, the numerical values given below are merely illustrative and not limiting of an asymmetrical ballast transformer of the present invention. Typical values for operation of the ballast transformer of the present invention are 0-350 mTeslas, 0.97 coupling on primary, net loss <50 W between 20-500 kHz, 1 kV-50 kV peak volts pre-ignition, 0.50-5 kV volt peak operating, 0 volts output post-ignition state.

Figure 4:
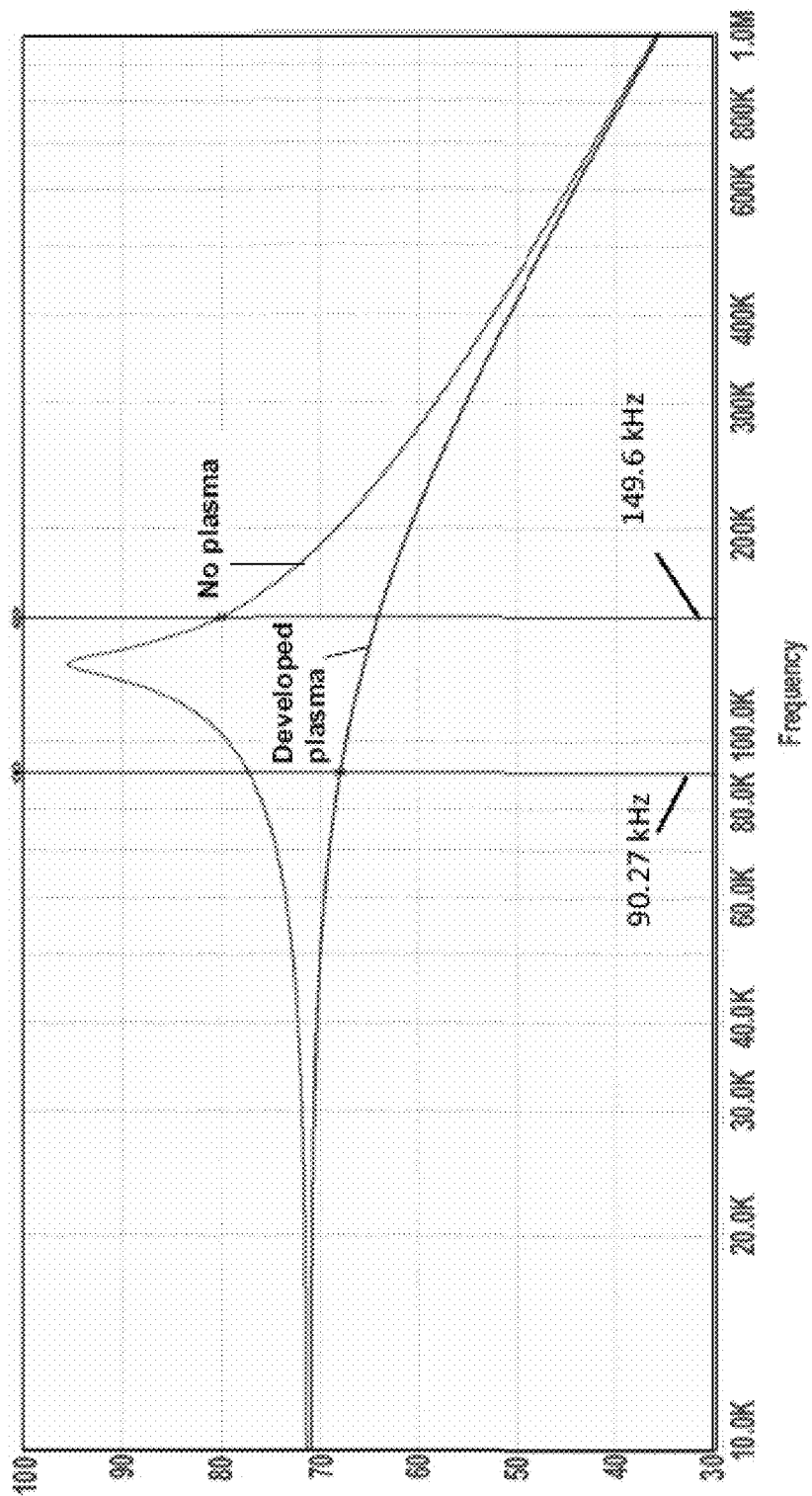
FIG. 4 is a schematic graph of frequency vs impedance sweep of using a ballast transformer for different loads.

FIG. 4 is a graph of frequency vs impedance sweep characteristic of the ballast transformer circuit for a "no plasma" case and for a developed plasma case. Two points/frequencies marked are for plasma operation (to the left, 90.27 kHz) and pre-ignition (to the right, 149.6 kHz). These frequencies will vary with a particular coax cable type and length (FIG. 2, coaxial cable 140 and its cable capacitance 142). If the cable capacitance changes, the operating points/frequencies change for the same output. Note the scale depicted is magnitude dB relative to 1 volt at the output of the cable (i.e. at the pen/torch/plasma port). 80 dB volt is 10,000 volts. 68 dB volt is 2,500 volts amplitude or peak. In FIG. 4, the no plasma curve represents a very high load impedance (here calculated for 100 k Ohms, but it may be 1 megaohm or higher). In FIG. 4, the fully developed plasma curve represents a load of 2000 Ohms. The type of pen/torch used for these calculations was assumed to be a high voltage plasma type with a relatively high impedance while running.

In one embodiment of the invention, the frequency of operation can be moved from 149.6 kHz toward a lower frequency (toward the peak resonance frequency) in order to develop higher ignition voltages (than would exist at 149.6 kHz) and thereafter moved to even lower frequencies (once ignited) to couple more plasma power once ignited and developed.

Figure 5:
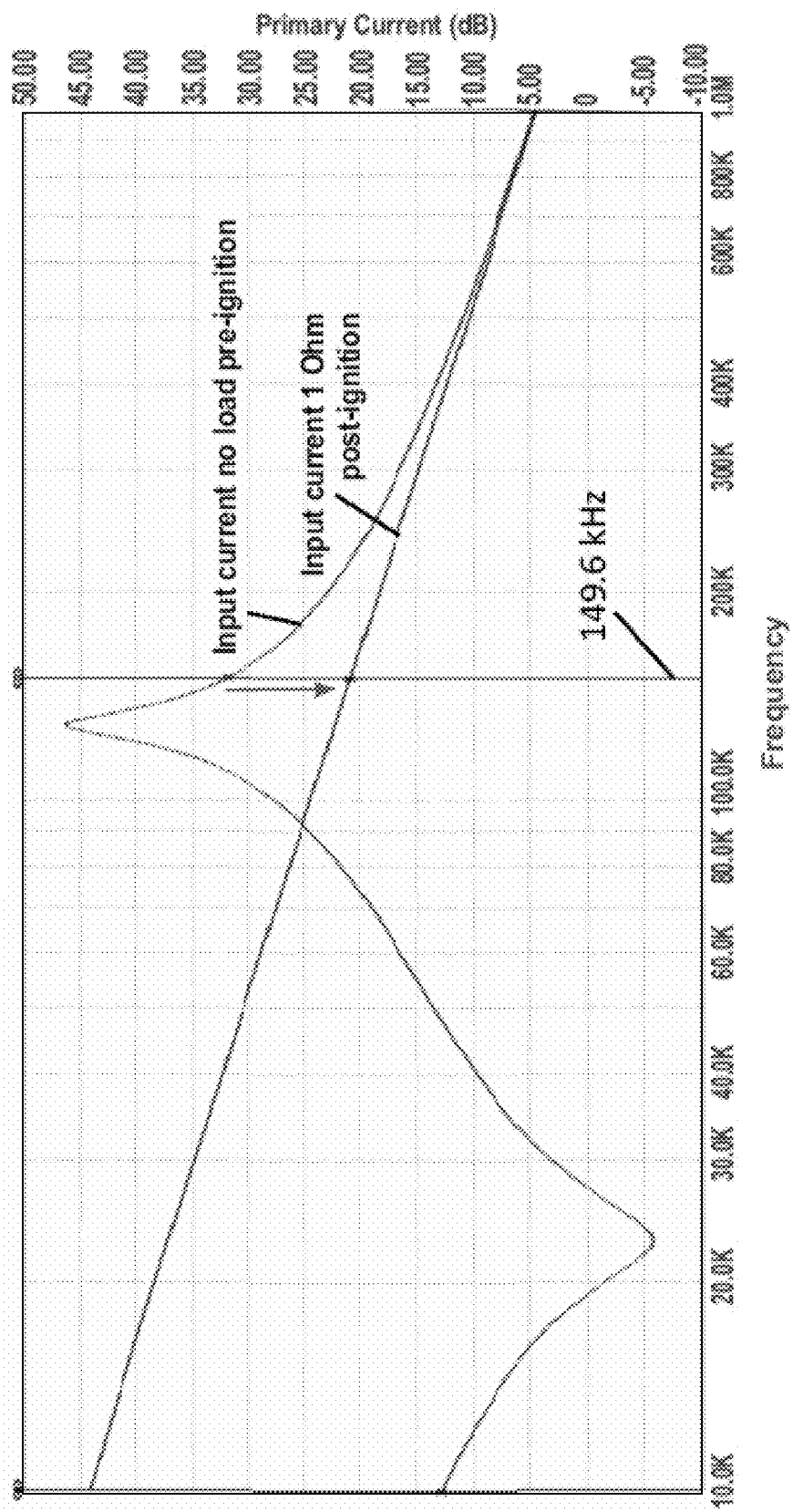
FIG. 5 is a schematic graph of a current transfer frequency sweep for different loads coupled to a ballast transformer, one with no load (pre-ignition of plasma) and the other at post ignition.
Figure 6:
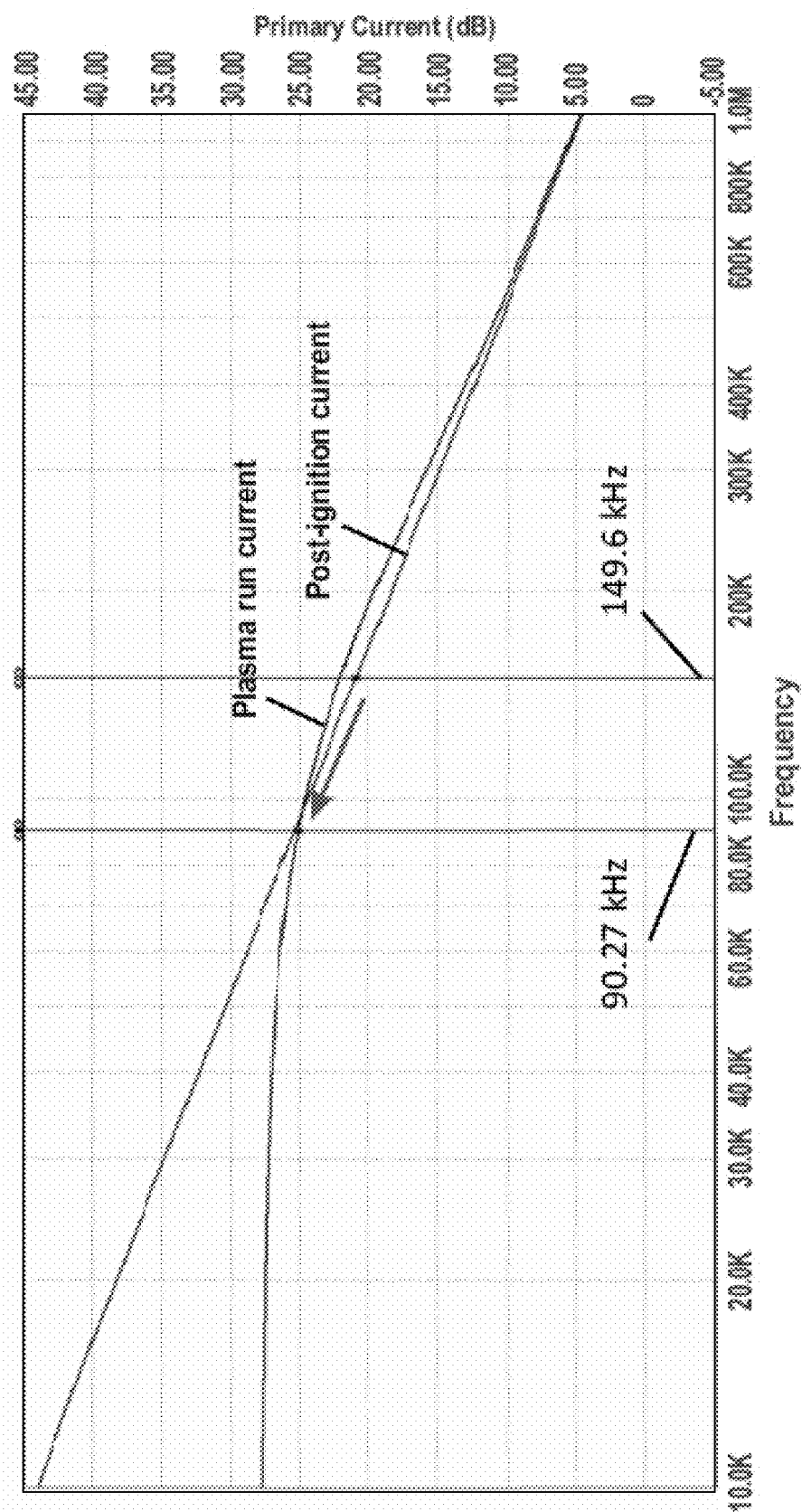
FIG. 6 is a schematic graph of a current transfer frequency sweep for a post ignition plasma load and a fully developed plasma load.

One plasma condition that is not shown in FIG. 4 is the state immediately post ignition when the plasma is very small in size and has an impedance of 1 Ohm or less. This condition is depicted in FIG. 5, a graph comparing input current for pre-ignition and post-ignition. In FIG. 5, the scale on the right is in dB Amperes relative to 1 Ampere peak. Specifically, FIG. 5 shows the input current as a function of frequency for a no load pre-ignition, and shows the input current as a function of frequency for a 1 Ohm post-ignition state (not a fully developed plasma). At startup, the input current with no load condition (simulation is 100 k Ohms) is at about 32 dB or 39.8 Amperes peak. When the plasma ignites, the input current is relatively small and has a relatively low impedance as compared to the fully developed plasma state and simulated here with a resistance 1 Ohm. Note that the input current at plasma ignition actually drops to about 21 dB or 11.2 Amperes peak. Thereafter, as shown in FIG. 6, the plasma develops (expands) and the input current increases as the frequency of operation is lowered to 90.27 kHz or lower.

More specifically, as the plasma develops, the impedance increases moving the current from the post-ignition current curve to the plasma-run current curve, and the frequency is adjusted to 90.27 kHz in this example to develop full power. Thus the ballast transformer is used to permit the system to generate ignition voltages (FIG. 4), withstand the sudden load transition from very high to near shorted conditions (FIG. 5) and then smoothly move to full power plasma (FIG. 6).

Waveform Informational Content

Normally, it is not easy or routine to obtain the output voltage waveform or amplitude on a stepped up/load side of a ballast transformer using conventional means. In general, it is not desirable to measure output voltage directly on the stepped up/load side because the system in certain embodiments can operates up to 2-50 kV. Such high voltage measurement devices are large, expensive and subject to humidity effects, corona degradation, and surface contamination, owing to their high impedance operation. For a ballast transformer, input voltage remains the same whether the output load is very high impedance, normal, or even a short. Yet, the present invention has found that, unlike the primary drive voltage, the primary drive current waveshape changes substantially when the load is changed.

Figure 7:
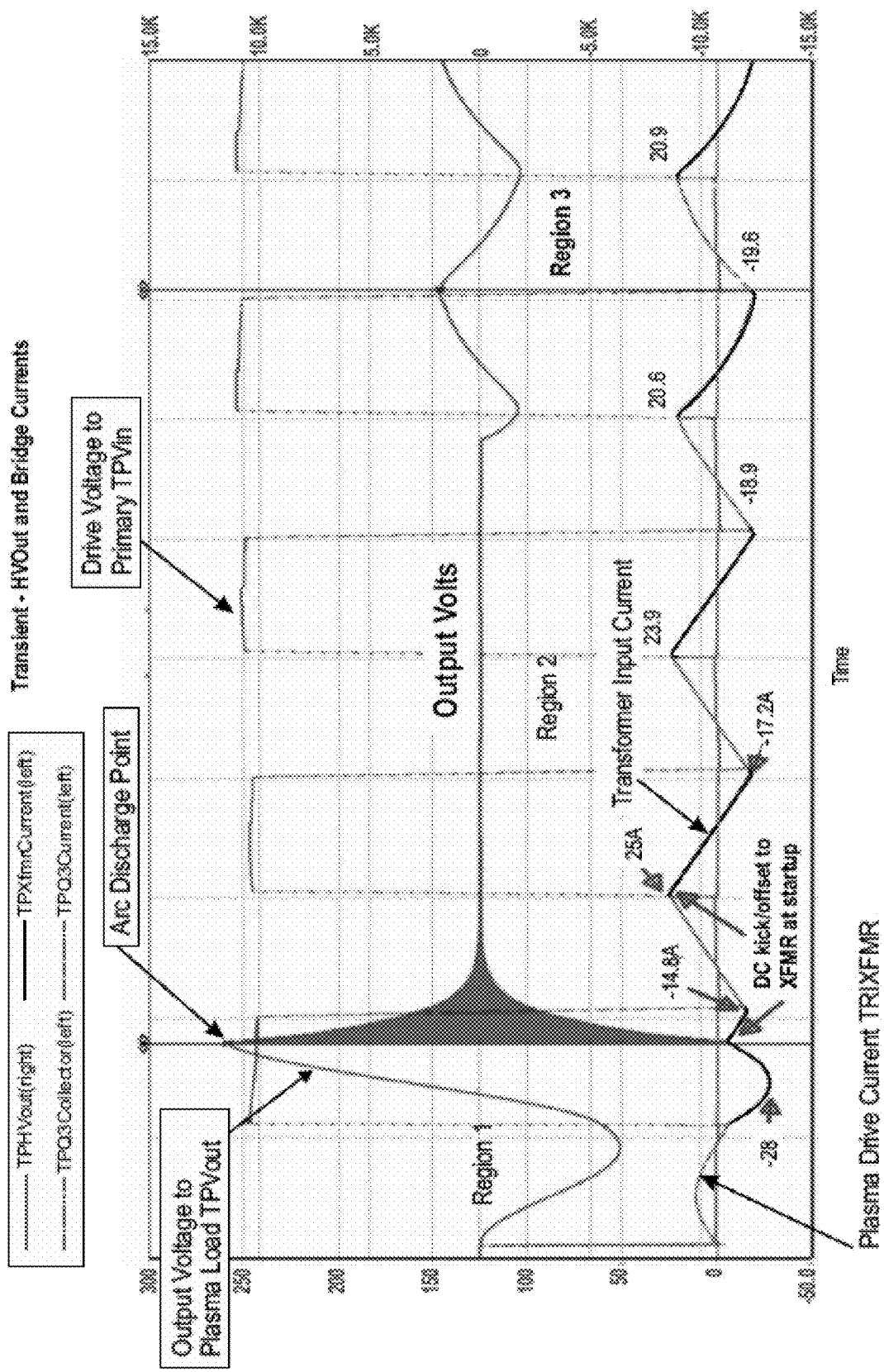
FIG. 7 is a schematic depiction showing a computer analysis of the circuit shown in FIG. 1 driven with a square wave drive.

FIG. 7 is a schematic depiction showing an analysis of the circuit shown in FIG. 2 driven with a square wave voltage pulse at TPVin. FIG. 7 shows the voltage waveform on the secondary side of the transformer at TPVout as output volts and at TPIXFMR (i.e., the plasma drive waveform) as transformer input current. In Region 1, there is no plasma, and thus no circuit load. Under this condition, circulating current builds up voltage and current in the secondary side of the ballast transformer until there is an arc in the electrode gap in the pen/torch of the atmospheric plasma source. In Region 1, the current waveform at TPIXFMR is roughly sinusoidal. This is the "no plasma" state. Control 116 is programmed to recognize this roughly sinusoidal waveform as the "no plasma state" operational condition.

When the arc happens at the arc discharge point, there is a reduction of the voltage on the secondary side caused by the coaxial cable 140 ringing down (over a short time) to zero volts because the load (the arc) is a short, i.e, a low resistance, to ground. Under this condition in Region 2 as shown on FIG. 7, the current trace then transitions to a sawtooth with straight line segments. A square wave voltage drive naturally creates straight current line segments with a short as load because:

$$V = -L_s \frac{di}{dt}$$

$$\frac{di}{dt} = \frac{-V}{L_s}$$

The slope or rate of change for I, current, is constant because V is constant during any half cycle (square voltage wave drive) and $L_s$ is a constant. Region 2 is the "plasma origination" state. Control 116 is programmed to recognize this sawtooth pattern with straight line segments as the "plasma origination" state.

Figure 8:
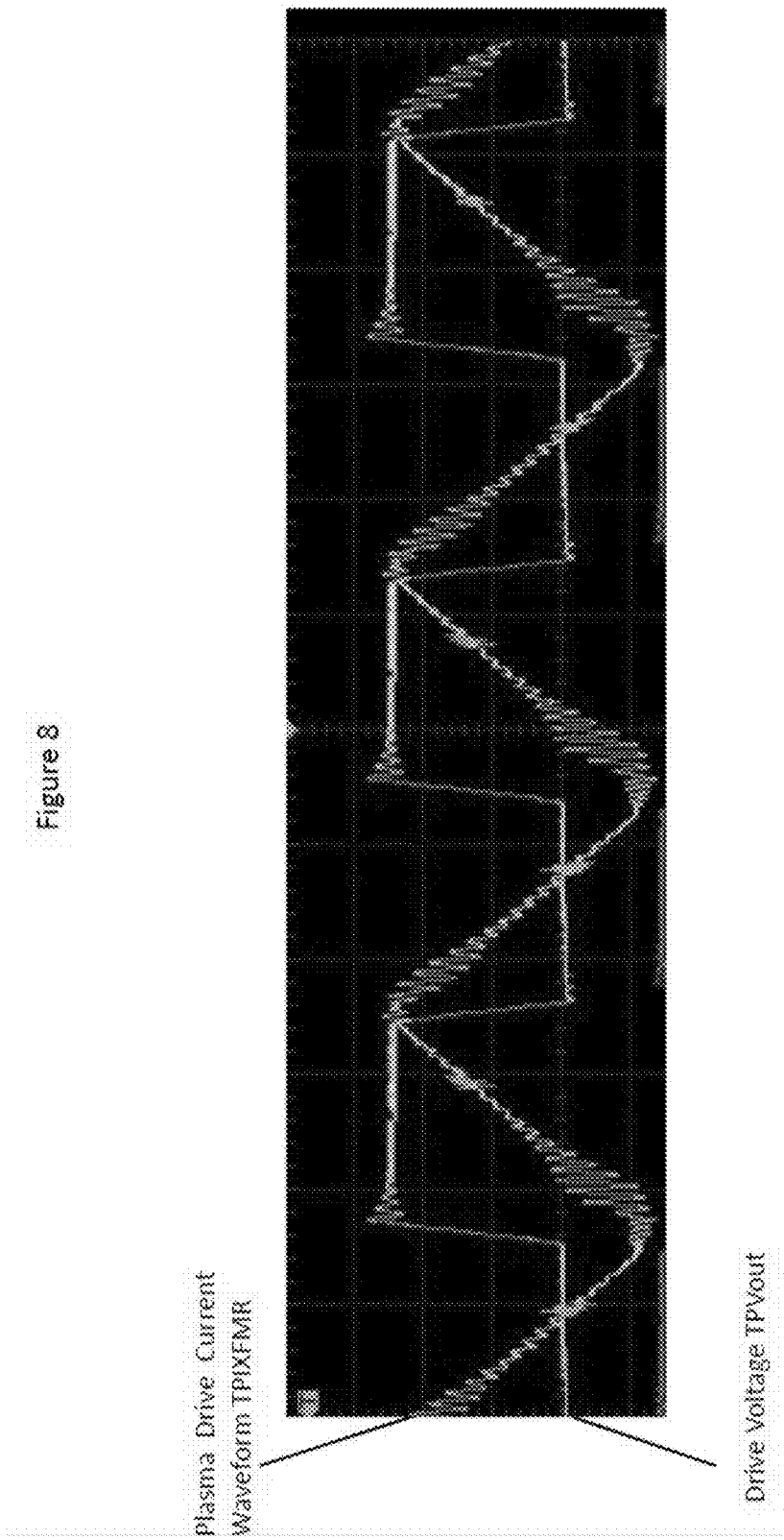
FIG. 8 is a schematic depicting a current waveshape for a plasma origination state.

FIG. 8 is a reproduction of an actual scope trace showing the sawtooth plasma drive current waveform and the voltage drive in Region 2. Eventually, the plasma grows until there is a resistive plasma load resulting in an instantaneous current that rises in a classic R/L or exponential curve to an asymptotic value:

$$i = i_o \left( 1 - e^{-\left( R_{pen} \frac{t}{L_s} \right)} \right)$$

Figure 9:
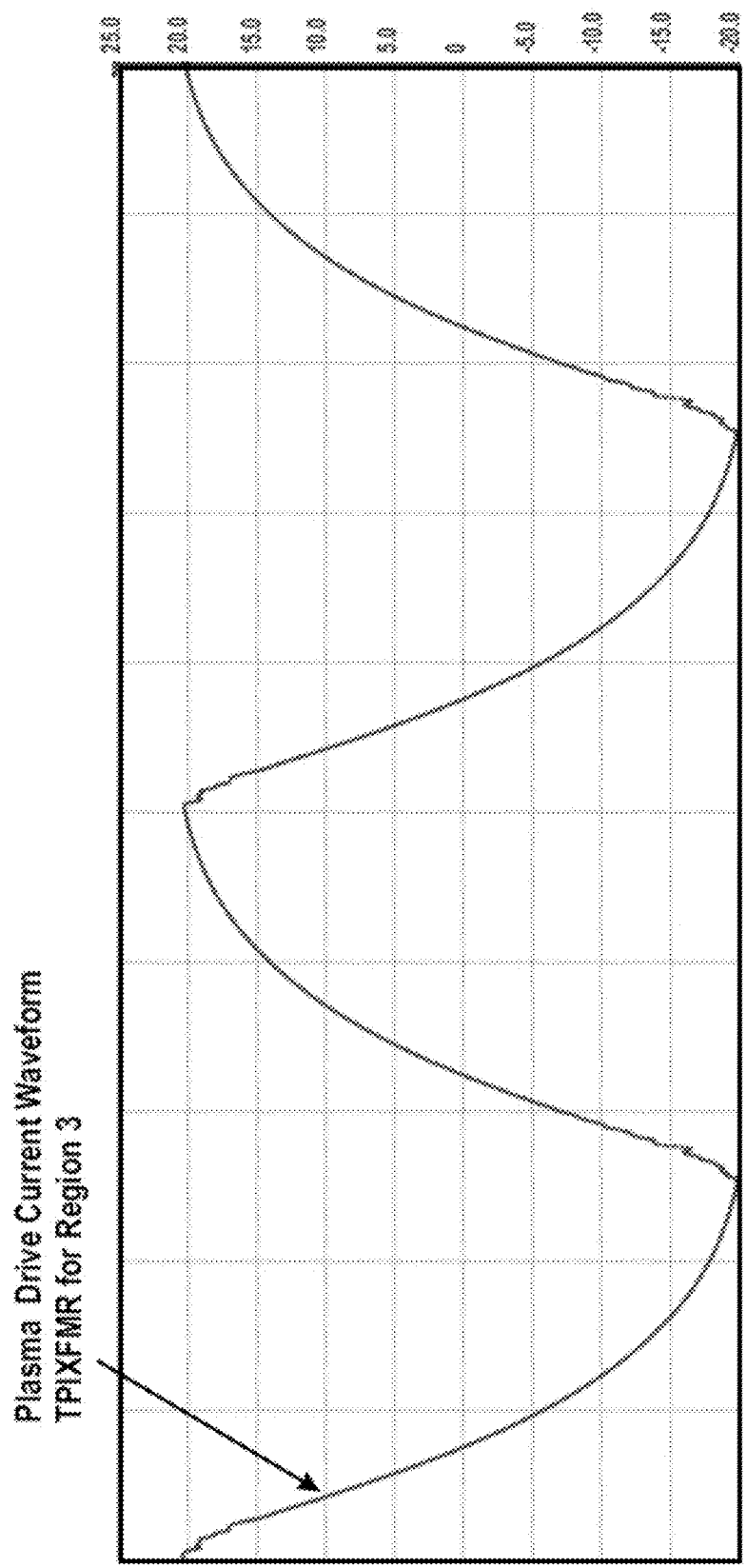
FIG. 9 is a schematic depicting a simulated current waveshape for a developed plasma maintenance state.

FIG. 9 is a schematic depicting a simulated current waveshape for a developed plasma occurring in Region 3 shown in FIG. 7. Notice in FIG. 9 that the drive phase reverses before a final settled current value is reached. Region 3 is the "plasma maintenance" state operating with a significant resistive plasma load. Control 116 is programmed to recognize this exponential curve or asymptotic value approaching pattern as the "plasma maintenance" state.

Hence, in one embodiment of the invention, programmed control 116 can identify the state of plasma formation by analyzing the primary current wave shape at TPIXFMR in the primary without having special probes on the high voltage secondary. Also, it is possible to use the primary drive voltage and primary current together to find input power as follows:

$$P = i^2 R_{pen}$$

$$R_{pen} = \frac{P}{i^2}$$

Control 116 in one embodiment can calculate plasma resistance so that the measured plasma resistance confirms a plasma operational state.

In one embodiment, control 116 can determine a particular plasma drive waveform shape by autocorrelation with a set of suitably scaled and shifted sample waveforms such that the autocorrelation with highest correlation coefficient is then a determination of the closest prototype shape, and thus determines which operational state exists at that time.

In one embodiment, control 116 can determine a particular plasma drive waveform shape by a Fourier Series Analysis, in which a correlation with the sine and cosine of the 1st and 3rd harmonics, deriving a relative angle between them. This is possible with control 116 being preprogrammed with the bridge drive voltage pulse shape and analog to digital conversion (ADC) sample frequencies so that control 116 knows the number of ADC samples per bridge cycle. Typically, only two bridge cycles of analysis are sufficient. It is not necessary to find the drive cycle phase as long as two complete cycles' worth of ADC samples is used. Note that using more complete inverter cycles for the Fourier or spectral analysis is equivalent to running through a longer autocorrelation analysis and serves to reject noise. The waveshape information is contained in the current's spectral angle.

Figure 10:
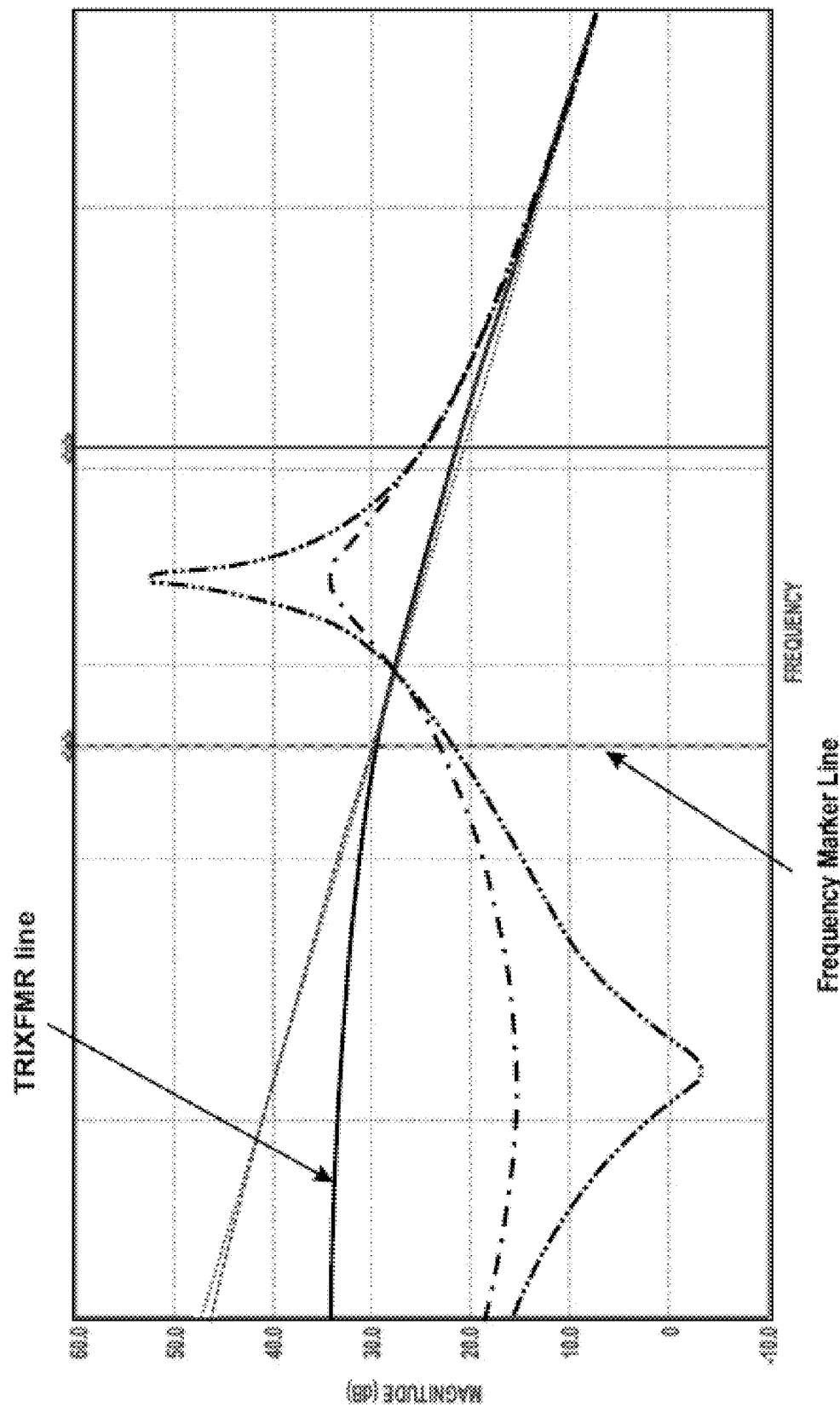
FIG. 10 is a schematic depicting computed current transfer function amplitudes for various output loads.

Note that other mathematical analysis/transformation techniques besides a Fourier Series Analysis can be used by control 116 for analysis of waveform. Further, the waveform analysis need not necessarily be in the frequency domain but could be in the time domain More generally, it could be considered harmonic analysis. Other such techniques for use by the invention include wavelet and chirplet transforms FIG. 10 is a schematic depicting computed current transfer function amplitudes for various output loads. From the dashed frequency marker line in FIG. 10 and high in frequency for a typical output network, the current transfer spectrum is nearly the same for loads of 0.3-5 kOhms to very low values like 1 Ohm, a short. Drive spectrum remains the same, exhibiting odd harmonics for a square wave. Therefore, the current spectrum is controlled primarily by the load impedance.

Figure 11:
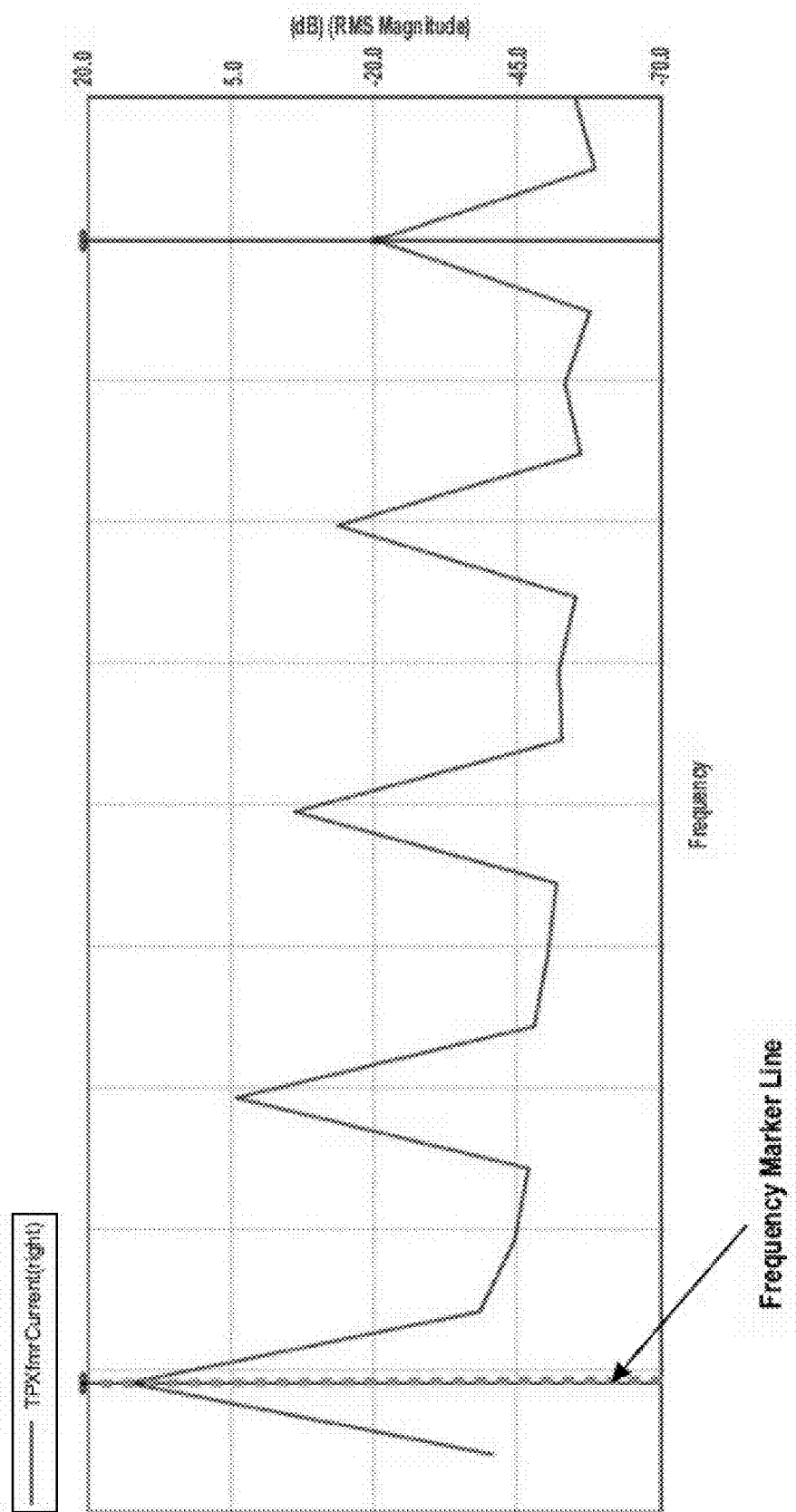
FIG. 11 is a current amplitude spectrum from a square wave drive into a ballast transformer for nominal plasma impedance.
Figure 12:
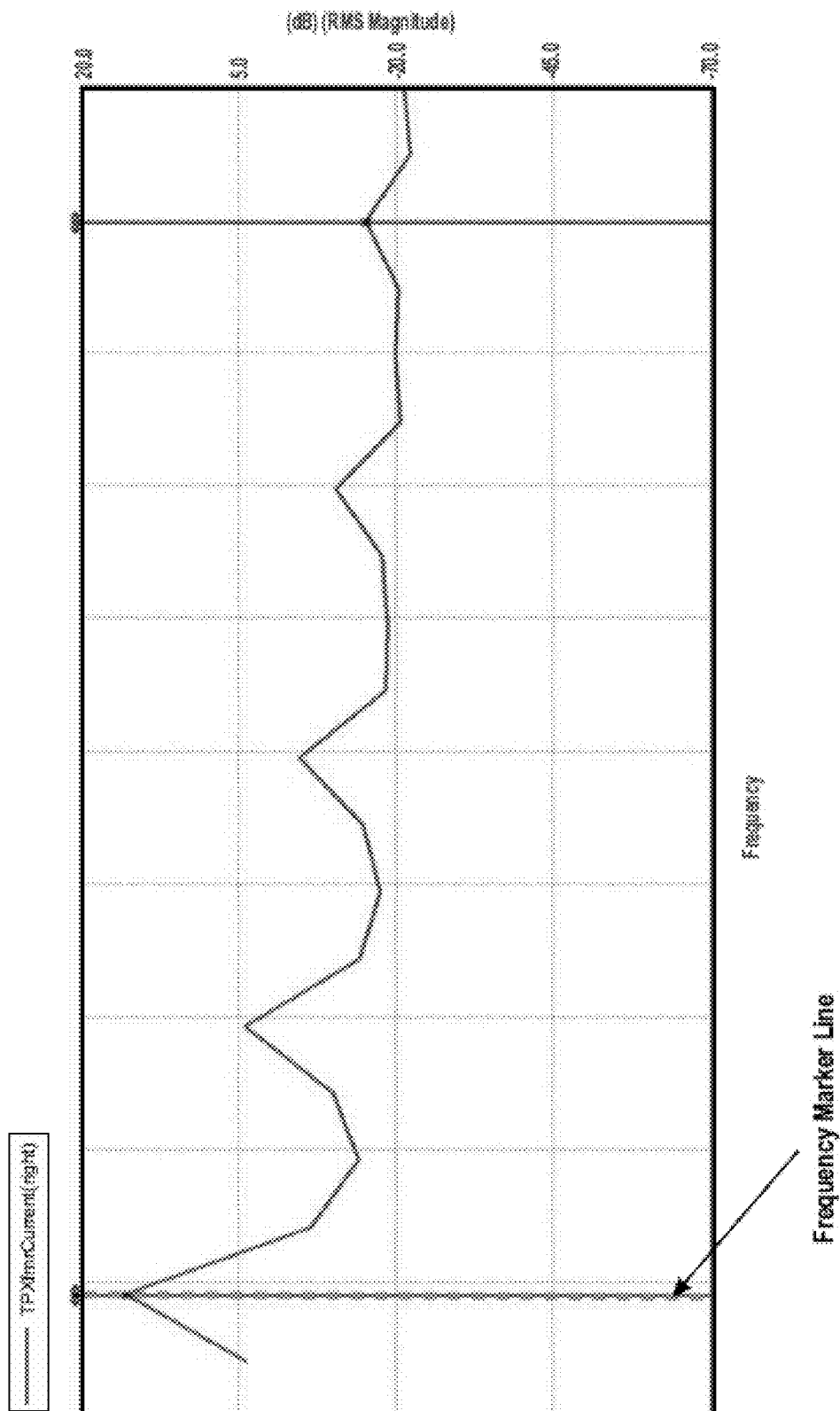
FIG. 12 is a current amplitude spectrum from a square wave drive into a ballast transformer for a 1 Ohm short.

FIG. 11 is a current amplitude spectrum from a square wave drive into a ballast transformer for nominal plasma impedance. FIG. 12 is a current amplitude spectrum from a square wave drive into a ballast transformer for a 1 Ohm short. In both cases, the 1st and 3rd harmonics have the same ratio, about 25 dB. Therefore, the relative angle is required for current waveshape ID. The vertical dotted frequency marker line is the inverter drive frequency, with the associated odd harmonics following to the right.

The current frequency transfer function of a developed plasma load (illustrated above in FIG. 7) shows that harmonics above the 3rd order are typically suppressed in Region 3 (i.e., in the operating or plasma maintenance state). Therefore, in one embodiment of the invention, a Fourier series is produced for 1st and 3rd harmonics only. Operation in the plasma state can be made or confirmed by observing the 1st amplitude and phase angle between 1st and $3^{rd}$ and/or by comparing these metrics to those in Region 2 of the plasma origination state. The harmonics in Region 2 or in the plasma origination state nominally should have a relative phase of near zero, and typically the 3rd amplitude should not be below 5% of the $1^{st}$ harmonic amplitude during normal operation. Also, typically, the 1st harmonic amplitude of the current should nominally be between 8 to 15 $A_{rms}$, although this value may be scaled up or down depending on the size of the plasma.

A relative angle above 45 degrees means that the plasma has transitioned from the plasma origination state to the plasma maintenance state, i.e, Region 3, the operating state. In one embodiment, a maximum of 130 degrees is used as an upper limit for the relative angle indicating that there is sufficient but not too much curve in the waveform. Therefore, relative angle determination can be used to determine that the plasma is developed and in a successful startup or continuing operation.

The utility of this analysis is that a low phase shift indicates a Region 2 startup triangle waveform (i.e., the plasma origination mode) which should not appear at any time during operation. If a low phase shift condition occurs, that would mean the plasma is undeveloped and near zero ohms, e.g., a small ignition spark. If left in this condition, the electrodes would soon be damaged. Also, there is no useful plasma under this condition. The software in control 116 is written to know to take corrective action which is for example at least to stop drive voltage, terminating the plasma and saving the electrodes (which are coupling power into the atmospheric pressure plasma). A loss of air pressure and flow into the system could cause this condition. A shorted plasma torch/pen cable or connector could also cause this condition. A blocked orifice could also cause this condition. Regardless, with the present invention, separate detectors (for any of these events such as an air pressure indicator or cable test circuit) are not needed (but could be used to supplement the present invention).

In short, as the air flow changes to a lower value or the plasma electrodes become too hot or the orifice becomes restricted but not blocked, the plasma drive waveform will begin to transition to a straight line and the phase angle difference will become lower and lower. In one embodiment of the present invention, control 116 can issue a system warning or a warning specifically to the operator of the atmospheric plasma system of the degrading plasma state. This warning can be issued when the plasma is exhibiting the same or nearly the same performance, and thus undetectable by the operator. This warning can be issued for example as a warning to the operator of a falling air flow condition which may to the operator appear satisfactory but when in reality it is not. Further, the control 116 can monitor the system as it ages and set a time for maintenance based on the age progression.

Plasma Waveform Discrimination

Figure 13:
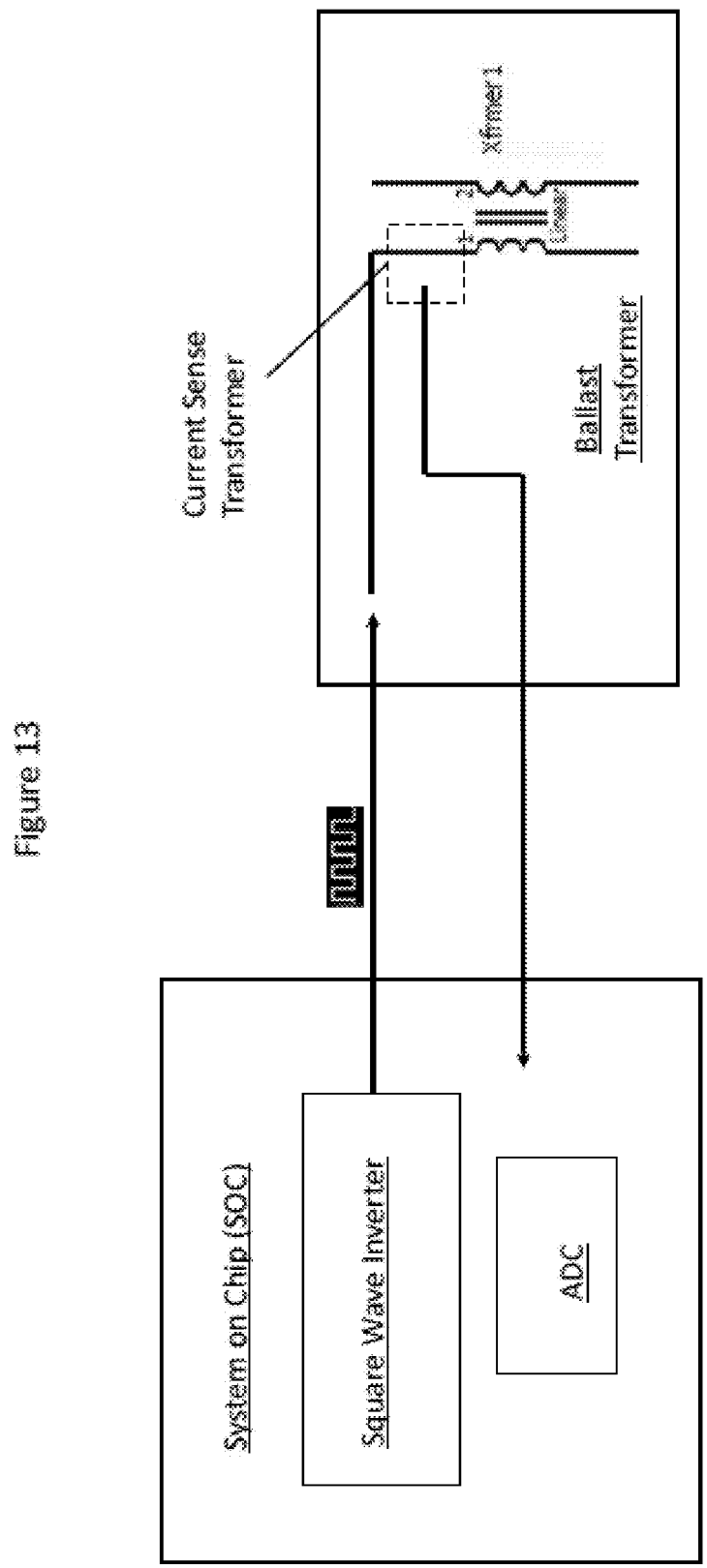
FIG. 13 is a schematic depicting a system on a chip (SOC) microprocessor for production of output waveforms driving a ballast transformer.

In this embodiment, an inverter output (shown schematically in FIG. 13) is used to drive a ballast transformer. Typically, four (4) high current, low loss, switching transistors are arranged in a full bridge circuit topology, with the plasma drive waveform being generated by a System on a Chip (SOC) microprocessor producing complementary transistor gate drive output waveforms. As shown in FIG. 13, a square wave inverter outputs voltage signals to the primary side of the ballast transformer. In one embodiment, a current sampling circuit is connected in series with the ballast transformer. In one embodiment, the current sampling circuit is a current sense transformer (CST) measuring current in the primary side of the ballast transformer. Analog outputs of the CST representative of the plasma current drive waveform are directed to the analog to digital converter (ADC) which in this embodiment is part of the SOC microprocessor shown on FIG. 13. The SOC microprocessor shown on FIG. 13 could be part of control 116 in FIGS. 1A and 1B.

Figure 14:
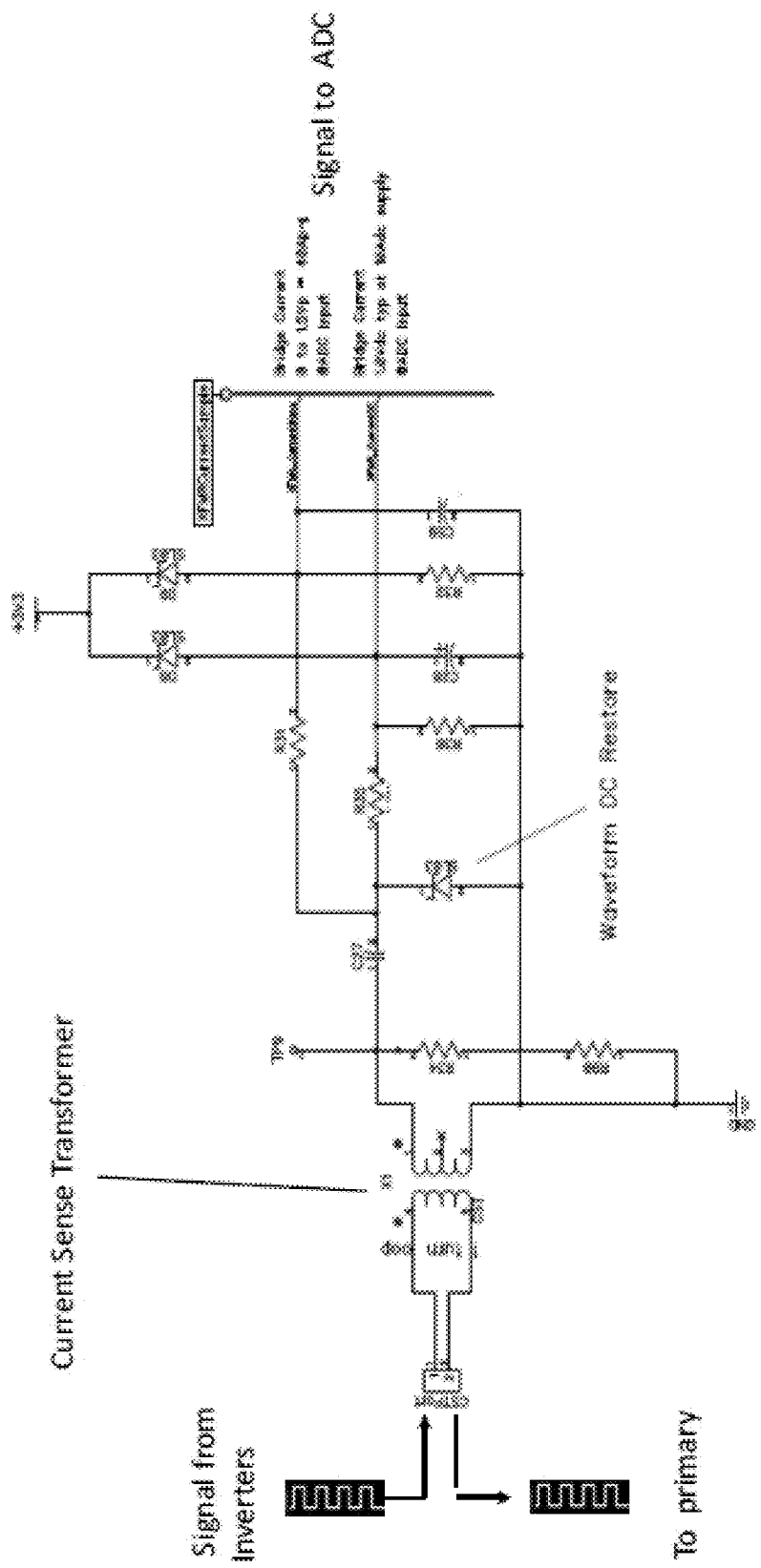
FIG. 14 is a schematic depicting a current sense transformer (CST) for measuring primary current in the ballast transformer of FIG. 13.

Specific details of a suitable current sampling circuit for the present invention are shown in FIG. 14. In FIG. 14, the current sampling circuit is connected at CSTPort where an appropriate current sensing transformer CST is provided. Current through the primary of the CST continues out of the current sampling circuit into the primary of the ballast transformer. The secondary side of the CST is connected in series with a load to set the current in the CST secondary to a suitable voltage conversion range by the current flowing through resistive loads R90 R34. C27 and D13 are simple DC Restorer circuits which change the AC waveform to a 0 to 'Y' range of the same amplitude. This change in the waveform is needed because the ADC in the SOC cannot handle negative voltages, but the information content is the same regardless of this change. Output from the 0 to 1.5 Vp or volt peak output is taken and connected to the input of the SOC ADC to produce a digital waveform trace.

Inside the SOC, in one embodiment, the ADC is arranged to run at least 8 times the rate of the inverter cycle rate. The preferred method is 20 times or more so that the waveform curve can be seen clearly in the fewest drive cycles. The relationship between the bridge drive and ADC sample rate which are both running from the same internal clock and thus have a fixed timing relationship for any particular ADC and direct memory access (DMA) transfer, is used to select any sequential 2-times or indeed N-times integral ADC sample cycles and perform a Fourier series analysis on one the 1st and 3rd harmonics sine and cosine correlation analysis without bothering to normalize. The fundamental phase angle as captured compared to the $1^{st}$ sample is:

a tan($1^{st}$ imaginary/$1^{st}$ real)

The $3^{rd}$ harmonic angle relative to the first sample is:

a tan($3^{rd}$ imaginary/$3^{rd}$ real)

The real series is that correlated with cosine function and the imaginary is that correlated with the sine function. An adjustment is then made by adding or subtracting 180 degrees to bring the $1^{st}$ and $3^{rd}$ angles into the $1^{st}$ & $2^{nd}$ quadrant, and then they are subtracted. This is equivalent to finding the first zero crossing of each and subtracting sample indices then converting that to $1^{st}$ degrees by normalizing with degrees per sample. Then 180 degrees is added or subtracted to bring into the $1^{st}$ and $2^{nd}$ quadrants. The resulting angle is the $1^{st}$ & $3^{rd}$ difference angles at the $1^{st}$ frequency. If this difference is less than 45 degrees when the plasma should be fully developed and operating in Region 3 of FIG. 5, controller 212 is programmed to throw a fault and set an alarm to the operator(s) to look for a problem. This recognition of a fault and the setting of the alarm can be all possible from one capture of the primary current waveform.

As noted above, a ballast transformer is but one way for the present invention to couple power to a plasma/Other power couplers can be used besides a transformer with this inventive method of waveform analysis working for a "transformer-less" plasma power supplies. Transformer-less power supplies are power supplies that can switch directly from a very high voltage source. For example, an inverter that operates at 25,000 volts and is able to switch the 25,000 volt DC into any arbitrary high voltage, high frequency waveform can provide power to a plasma. The use of a current sense transformer (CST) on the high voltage line of this type of inverter would permit similar analysis, with a high voltage CST being made relatively small.

A number of advantages are provided by the inventive system where the plasma state is ascertained from analysis of the plasma drive current waveforms. Some of these advantages include:

1. Current and/or especially voltage detection on the high voltage and power/load side of a transformer is not needed.

2. Only a few current sampling acquisitions are needed in order to determine a plasma operational state.

3. Waveshape analysis shows that the amplitude of the 1st and 3rd harmonics in the plasma drive current waveform are sufficient for determining if the gas pressure or gas flow rate is adequate for plasma maintenance without the need for separate gas pressure and flowrate sensors.

4. Repeated waveform analysis over time can identify developing faults in the plasma condition without need for separately installed fault detectors since repeated waveform analysis provides knowledge of the plasma condition as a function of time.

5. The power dissipated can be measured at the same time that the plasma drive current waveform is measured using a bridge DC measurement device and software integrating the average drive voltage and bridge output current product.

6. The relative (or exact) plasma impedance, and thus the resistance and approximate temperature and thereby the plasma density or charge carrier condition in the plasma can be deduced from the waveshape and simulation of the output network.

Computer Control

It will be understood that the control 116 schematically illustrated in FIGS. 1A and 1B may also be representative of one or more types of user devices, such as user input devices (e.g., keypad, touch screen, mouse, and the like), user output devices (e.g., display screen, printer, visual indicators or alerts, audible indicators or alerts, and the like), a graphical user interface (GUI) controlled by software for display by an output device, and one or more devices for loading media readable by control 116 (e.g., logic instructions embodied in software, data, and the like). Control 116 may include an operating system (e.g., Microsoft Windows® software) for controlling and managing various functions.

Figure 15:
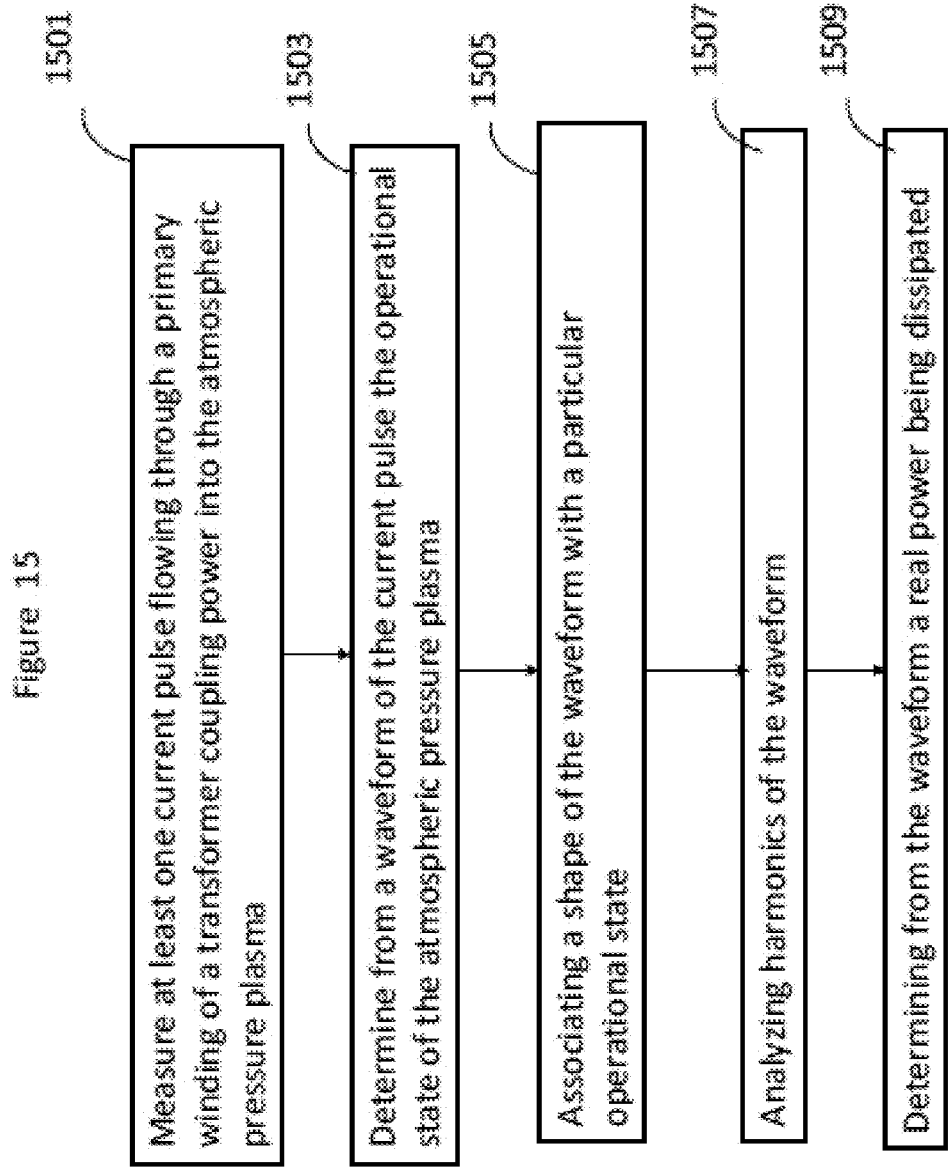
FIG. 15 is a flow chart detailing a method of the present invention for detecting an operational state of an atmospheric pressure plasma.

FIG. 15 is a flowchart detailing a method of the present invention for detecting an operational state of an atmospheric pressure plasma.

In step 1501, at least one current pulse flowing through a primary winding of a transformer coupling power is measured (sampled or sensed).

In step 1503, from a waveform of the current pulse, the operational state of the atmospheric pressure plasma is determined.

In optional step 1505, the determination can occur by associating a shape of the waveform with a particular operational state of the atmospheric pressure plasma. As noted above, a sinusoidal waveform is indicative of a "no plasma state," a sawtooth waveform with straight line segments is indicative of the "plasma origination state" in which an arc ignited in the plasma chamber is expanding into a plasma by gas flow thereinto, and an asymptotic waveform is indicative of the "plasma maintenance state."

In optional step 1507, the determination can occur by analyzing harmonics of the waveform and comparing the magnitudes of the $1^{st}$ and $3^{rd}$ harmonics, and realizing that, with the plasma maintenance state having the highest (plasma) load resistance, higher harmonics would be suppressed.

In optional step 1509, the determination can occur by determining from the waveform a real power in each pulse being dissipated, and realizing that, in the plasma maintenance state, the plasma load resistance is the highest.

Moreover, while not shown, in step 1503, a relative angle between a) the voltage pulse applied to the primary winding and b) the waveform of the current pulse can be calculated, and based on the relative angle between a) the voltage pulse applied to the primary winding and b) the waveform of the current pulse, the operational state of the atmospheric pressure plasma can be ascertained. For example, as noted above, when the plasma origination state matures into the plasma maintenance state, a relative angle between current and voltage is observed to be above 45 degrees.

It will be understood that one or more of the processes, sub-processes, and process steps described herein may be performed by hardware, firmware, software, or a combination of two or more of the foregoing, on one or more electronic or digitally-controlled devices for example adjusting the variable capacitors and/or the relative bobbin positions and/or the power level of the AC source. The software may reside in a software memory (not shown) in a suitable electronic processing component or system such as, for example, the control 116 schematically depicted in FIGS. 1A and 1B. The software memory may include an ordered listing of executable instructions for implementing logical functions (that is, "logic" that may be implemented in digital form such as digital circuitry or source code, or in analog form such as an analog source such as an analog electrical, sound, or video signal). The instructions may be executed within a processing module, which includes, for example, one or more microprocessors, general purpose processors, combinations of processors, digital signal processors (DSPs), or application specific integrated circuits (ASICs). Further, the schematic diagrams describe a logical division of functions having physical (hardware and/or software) implementations that are not limited by architecture or the physical layout of the functions. The examples of systems described herein may be implemented in a variety of configurations and operate as hardware/software components in a single hardware/software unit, or in separate hardware/software units.

The executable instructions may be implemented as a computer program product having instructions stored therein which, when executed by a processing module of an electronic system (e.g., the control 116 schematically depicted in FIGS. 1A and 1B), direct the electronic system to carry out the instructions. The computer program product may be selectively embodied in any non-transitory computer-readable storage medium for use by or in connection with an instruction execution system, apparatus, or device, such as a electronic computer-based system, processor-containing system, or other system that may selectively fetch the instructions from the instruction execution system, apparatus, or device and execute the instructions. In the context of this disclosure, a computer-readable storage medium is any non-transitory means that may store the program for use by or in connection with the instruction execution system, apparatus, or device. The non-transitory computer-readable storage medium may selectively be, for example, an electronic, magnetic, optical, electromagnetic, infrared, or semiconductor system, apparatus, or device. A non-exhaustive list of more specific examples of non-transitory computer readable media include: an electrical connection having one or more wires (electronic); a portable computer diskette (magnetic); a random access memory (electronic); a read-only memory (electronic); an erasable programmable read only memory such as, for example, flash memory (electronic); a compact disc memory such as, for example, CD-ROM, CD-R, CD-RW (optical); and digital versatile disc memory, i.e., DVD (optical). Note that the non-transitory computer-readable storage medium may even be paper or another suitable medium upon which the program is printed, as the program can be electronically captured via, for instance, optical scanning of the paper or other medium, then compiled, interpreted, or otherwise processed in a suitable manner if necessary, and then stored in a computer memory or machine memory.

It will also be understood that the term "in signal communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

More generally, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

Exemplary Statements of the Invention

The following numbered statements of the invention set forth a number of inventive aspects of the present invention:

Statement 1. A system for determining an operational state of an atmospheric pressure plasma, the system comprising:
 a power coupler for coupling power into the atmospheric pressure plasma;
 a current sampling circuit configured to sample at least one current pulse flowing through a primary winding of the transformer; and
 a programmed microprocessor configured to determine, from a waveform of the current pulse, the operational state of the atmospheric pressure plasma,
 wherein the operational state comprises one of
 a no plasma state,
 a plasma origination state indicative of an ignited arc expanding into a plasma by gas flow thereinto, and
 a plasma maintenance state indicative of the plasma being expanded.

Alternatively, there is provided a system for determining operational states of an atmospheric pressure plasma, the system comprising
 a power coupler for coupling power into the atmospheric pressure plasma,
 a current sampling circuit configured to sample at least one current pulse flowing to a plasma-generating region, and
 a programmed microprocessor configured to determine, from a waveform of the current pulse, the operational state of the atmospheric pressure plasma. The operational state is one of: a no plasma state, a plasma origination state indicative of an ignited arc expanding into a larger volume of plasma by gas flow thereinto, and a plasma maintenance state indicative of the plasma being expanded.

Statement 2. The system of statement 1, wherein the current sampling circuit comprises a current sense transformer (CST) connected to the primary winding of the transformer. More generally, the CST is in place between the power coupler and the plasma generating region.

Statement 3. The system of statements 1 or 2, wherein the at least one current pulse flowing through a primary winding is driven by a voltage pulse applied to the primary winding of the transformer.

Statement 4. The system of any of the statements above, including the alternative configurations, wherein the programmed microprocessor comprises an analog to digital converter (ADC) in electrical communication with the current sampling circuit in order to capture a digital trace of the waveform of the current pulse for analysis.

Statement 5. The system of statement 4, wherein the programmed microprocessor is configured to identify from the digital trace that:
 a sinusoidal waveform is indicative of the no plasma state;
 a sawtooth waveform is indicative of the plasma origination state, where segments of the sawtooth waveform are preferably straight line segments; and
 an asymptotic waveform having a section exponentially approaching an asymptotic value. (One asymptotic waveform is illustrated in the shapes depicted in FIG. 9.)

Statement 6. The system of statement 4, wherein the programmed microprocessor is configured to identify harmonics of the waveform.

Statement 7. The system of statement 6, wherein the programmed microprocessor is configured to ascertain the operational state of the atmospheric pressure plasma based on relative strengths of the harmonics.

Statement 8. The system of statement 4, wherein the programmed microprocessor is configured to
 calculate a relative phase angle between a) the voltage pulse applied to the primary winding and b) the waveform of the current pulse, and
 based on the relative phase angle, ascertain the operational state of the atmospheric pressure plasma.

Statement 9. The system of claim 8, wherein the programmed microprocessor is configured to calculate an average current in the current pulse, and an average voltage of the voltage pulse, and thereby a real power being dissipated, and
 based on the real power, ascertain the operational state of the atmospheric pressure plasma.

Statement 10. The system of any of the statements above, further comprising an inverter (e.g., a square wave inverter) configured to produce voltage pulses at a predetermined frequency for application to the primary winding of the transformer.

Statement 11. The system of statement 1, wherein the transformer comprises a ballast transformer having
 a magnetic core,
 a primary winding on a primary side of the magnetic core,
 a secondary winding on a secondary side of the magnetic core, and
 wherein
 the primary winding is connectable to a power source, and
 the secondary winding is connectable to a plasma load of the atmospheric pressure plasma.

Statement 12. The system of statement 11, wherein the ballast transformer comprises a resonant transformer having a resonance associated with a capacitance and an inductance appearing across open ends of the secondary winding.

Statement 13. The system of statement 11, wherein the secondary winding has more turns than the primary winding such that the transformer comprises a step-up transformer for supplying current to the atmospheric pressure plasma.

Statement 14. The system of statement 11, wherein the primary winding comprises a first primary winding and a second primary winding.

Statement 15. The system of claim 14, wherein the first primary winding and the second primary winding provide an inductive impedance that opposes current surges when a load is introduced.

Statement 16. The system of statement 14, wherein the second primary winding is displaceable from the secondary winding to alter a coupling coefficient of the transformer.

Statement 17. The system of statement 14, wherein the second primary winding coaxially surrounds the secondary winding.

Statement 18. The system of statement 14, wherein the second primary winding is offset axially from and surrounds the secondary winding.

Statement 19. The system of any of the statements above, further comprising:

an inverter configured to produce voltage pulses at a predetermined frequency for application to the primary winding of the transformer (the inverter can produce square wave pulses, non-square pulses, sinusoidal pulses, or any arbitrary pules generated for example from a modulated bipolar drive);

an analog to digital converter (ADC) in electrical communication with the current sampling circuit in order to capture a digital trace of the waveform of the current pulse for analysis.

Statement 20. The system of statement 19, wherein the microprocessor, the square wave inverter, and the analog to digital converter (ADC) comprise a system on chip (SOC) component comprising a controller for the system.

Statement 21. A method for determining an operational state of an atmospheric pressure plasma using any of the systems described in the statements above.

Statement 22. The method of statement 21, wherein the method comprises:

sampling at least one current pulse flowing through a primary winding of a transformer coupling power into the atmospheric pressure plasma; and determining, from a waveform of the current pulse, the operational state of the atmospheric pressure plasma.

Alternatively, there is provided a method which samples at least one current pulse flowing into the atmospheric pressure plasma; and determines, from a waveform of the current pulse, the operational state of the atmospheric pressure plasma.

Statement 23. The method of statement 22 and its alternative, wherein the determination occurs by associating a shape of the waveform with a particular operational state of the atmospheric pressure plasma.

Statement 24. The method of statement 22, wherein the determination occurs by analyzing harmonics of the waveform.

Statement 25. The method of statement 22, wherein the determination occurs by determining from the waveform a real power in each pulse being dissipated, and realizing that, in the plasma maintenance state, the plasma load resistance is the highest.

Statement 26. The method of statement 22, wherein the determination occurs by calculating a relative phase angle between a) the voltage pulse applied to the primary winding and b) the waveform of the current pulse, and based on the relative phase angle, ascertaining the operational state of the atmospheric pressure plasma.

Statement 27. A ballast transformer as described above in any of the statements 11-18 and whose operation is controlled in part by the systems described in any of the statements above.

Numerous modifications and variations of the invention are possible in light of the above teachings. It is therefore to be understood that within the scope of the appended claims, the invention may be practiced otherwise than as specifically described herein.

The invention claimed is:

1. A system for determining an operational state of an atmospheric pressure plasma, the system comprising:

a transformer for coupling power into the atmospheric pressure plasma;

a current sampling circuit configured to sample at least one current pulse flowing through a primary winding of the transformer; and a programmed microprocessor configured to determine, from a waveform of the current pulse, the operational state of the atmospheric pressure plasma, wherein the operational state comprises one of a no plasma state, a plasma origination state indicative of an ignited arc expanding into a larger plasma volume by gas flow thereinto, and a plasma maintenance state indicative of the plasma being expanded into the desired volume and steady-state condition wherein the at least one current pulse flowing through a primary winding is driven by a voltage pulse applied to the primary winding of the transformer, the programmed microprocessor comprises an analog to digital converter (ADC) in electrical communication with the current sampling circuit in order to capture a digital trace of the waveform, and the programmed microprocessor is configured to identify from the digital trace:

a sinusoidal waveform that is indicative of the no plasma state;

a sawtooth waveform indicative of the plasma origination state, where segments of the sawtooth waveform are straight line segments; and and an asymptotic waveform indicative of the plasma maintenance state having a section exponentially approaching an asymptotic value.

2. The system of claim 1, wherein the current sampling circuit comprises a current sense transformer (CST) connected across the primary winding of the transformer.

3. The system of claim 1, wherein the programmed microprocessor is configured to identify harmonics of the waveform.

4. The system of claim 3, wherein the programmed microprocessor is configured to ascertain the operational state of the atmospheric pressure plasma based on relative strengths of the harmonics.

5. The system of claim 1, wherein the programmed microprocessor is configured to calculate a relative phase angle between a) a voltage pulse applied to the primary winding and b) the current pulse flowing through the primary winding, and based on the relative phase angle, ascertain the operational state of the atmospheric pressure plasma.

6. The system of claim 5, wherein the programmed microprocessor is configured to calculate an average current in the current pulse, and an average voltage of the voltage pulse, and thereby a real power being dissipated, and based on the real power, ascertain the operational state of the atmospheric pressure plasma.

7. The system of claim 1, further comprising a square wave inverter configured to produce voltage pulses at a predetermined frequency for application to the primary winding of the transformer.

8. The system of claim 7, wherein the transformer comprises a ballast transformer having
a magnetic core,
a primary winding on a primary side of the magnetic core,
a secondary winding on a secondary side of the magnetic core, and
wherein
the primary winding is connectable to a power source, and the secondary winding is connectable to a plasma load of the atmospheric pressure plasma.

9. The system of claim 8, wherein the ballast transformer comprises a resonant transformer having a resonance associated with a capacitance and an inductance appearing across open ends of the secondary winding.

10. The system of claim 8, wherein the secondary winding has more turns than the primary winding such that the transformer comprises a step-up transformer for supplying current to the atmospheric pressure plasma.

11. The system of claim 8, wherein the primary winding comprises a first primary winding and a second primary winding.

12. The system of claim 11, wherein a leakage inductance of the transformer opposes current surges when a plasma is initiated.

13. The system of claim 11, wherein the second primary winding is displaceable from the secondary winding to alter a coupling coefficient of the transformer.

14. The system of claim 11, wherein the second primary winding wraps around the secondary winding.

15. The system of claim 11, wherein the second primary winding is offset axially from the secondary winding.

16. The system of claim 1, further comprising:
an inverter configured to produce voltage pulses at a predetermined frequency for application to the primary winding of the transformer;
an analog to digital converter (ADC) in electrical communication with the current sampling circuit in order to capture a digital trace of the waveform of the current pulse for analysis.

17. The system of claim 16, wherein the microprocessor, the square wave inverter, and the analog to digital converter (ADC) comprise a system on chip (SOC) component comprising a controller for the system.

* * * * *